(12) United States Patent
Chiron (10) Patent No.: US 10,873,301 B2
(45) Date of Patent: *Dec. 22, 2020

(54) DUAL-INPUT VOLTAGE MEMORY DIGITAL PRE-DISTORTION CIRCUIT AND RELATED ENVELOPE TRACKING APPARATUS

(71) Applicant: Qorvo US, Inc., Greensboro, NC (US)

(72) Inventor: Jean-Frederic Chiron, Tournefeuille (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/377,689

(22) Filed: Apr. 8, 2019

(65) Prior Publication Data

US 2020/0321920 A1    Oct. 8, 2020

(51) Int. Cl.
  *H03F 1/32* (2006.01)
(52) U.S. Cl.
  CPC ......... *H03F 1/3247* (2013.01); *H03F 1/3258* (2013.01)
(58) Field of Classification Search
  CPC ........................... H03F 1/3247; H03F 1/3258
  USPC ................... 375/297; 455/114.3; 330/295
  See application file for complete search history.

(56) References Cited

U.S. PATENT DOCUMENTS

| | | | | |
|---|---|---|---|---|
| 9,973,370 | B1* | 5/2018 | Langer | H04W 52/365 |
| 10,491,162 | B2* | 11/2019 | Chiron | H03F 3/21 |
| 2013/0072139 | A1* | 3/2013 | Kang | H04B 1/0028 |
| | | | | 455/114.3 |
| 2015/0123735 | A1* | 5/2015 | Wimpenny | H03F 1/0227 |
| | | | | 330/295 |

* cited by examiner

*Primary Examiner* — Fitwi Y Hailegiorgis
(74) *Attorney, Agent, or Firm* — Withrow & Terranova, P.L.L.C.

(57) ABSTRACT

A dual-input voltage memory digital pre-distortion (mDPD) circuit and related ET apparatus are provided. In examples discussed herein, an ET apparatus includes an amplifier circuit(s) configured to amplify a radio frequency (RF) signal based on an ET voltage. A tracker circuit is configured to generate the ET voltage based on a number of target voltage amplitudes derived from a number of signal amplitudes of the RF signal. However, the tracker circuit can cause the ET voltage to deviate from the target voltage amplitudes due to various inherent impedance variations, particularly at a higher modulation bandwidth. In this regard, a dual-input voltage mDPD circuit is configured to digitally pre-distort the target voltage amplitudes based on the signal amplitudes such that the ET voltage can closely track the target voltage amplitudes. As such, it is possible to mitigate ET voltage deviation, thus helping to improve overall linearity performance of the ET apparatus.

20 Claims, 5 Drawing Sheets

DUAL-INPUT VOLTAGE MEMORY DIGITAL PRE-DISTORTION CIRCUIT AND RELATED ENVELOPE TRACKING APPARATUS

FIELD OF THE DISCLOSURE

The technology of the disclosure relates generally to envelope tracking (ET) power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency for a given instantaneous output power requirement of the RF signals.

SUMMARY

Aspects disclosed in the detailed description include a dual-input voltage memory digital pre-distortion (mDPD) circuit and a related envelope tracking (ET) apparatus. In examples discussed herein, an ET apparatus includes an amplifier circuit(s) configured to amplify a radio frequency (RF) signal based on an ET voltage. A tracker circuit is configured to generate the ET voltage based on a number of target voltage amplitudes derived from a number of signal amplitudes of the RF signal. However, the tracker circuit can cause the ET voltage to deviate from the target voltage amplitudes due to various inherent impedance variations and/or nonlinearities of the tracker circuit and the amplifier circuit(s), particularly at a higher modulation bandwidth (e.g., 60 MHz). In this regard, a dual-input voltage mDPD circuit is configured to digitally pre-distort the target voltage amplitudes based on the signal amplitudes such that the ET voltage can closely track the target voltage amplitudes. As such, it is possible to mitigate ET voltage deviation, thus helping to improve overall linearity performance of the ET apparatus.

In one aspect, a dual-input voltage mDPD circuit is provided. The dual-input voltage mDPD circuit includes a first port coupled to an input node of an ET engine circuit to receive a first digital signal having a number of signal amplitudes. The dual-input voltage mDPD circuit also includes a second port coupled to an output node of the ET engine circuit to receive a second digital signal having a number of voltage amplitudes corresponding to the signal amplitudes. The dual-input voltage mDPD circuit also includes a control circuit. The control circuit is configured to receive the first digital signal and the second digital signal from the first port and the second port, respectively. The control circuit is also configured to digitally pre-distort the voltage amplitudes based on the signal amplitudes to generate a digital target voltage signal having a number of target voltage amplitudes corresponding to the voltage amplitudes.

In another aspect, an ET apparatus is provided. The ET apparatus includes an ET engine circuit. The ET engine circuit includes an input node configured to receive a first digital signal having a number of signal amplitudes. The ET engine circuit also includes an output node configured to output a second digital signal having a number of voltage amplitudes corresponding to the signal amplitudes. The ET apparatus also includes a dual-input voltage mDPD circuit. The dual-input voltage mDPD circuit includes a first port coupled to the input node of the ET engine circuit to receive the first digital signal having the signal amplitudes. The dual-input voltage mDPD circuit also includes a second port coupled to the output node of the ET engine circuit to receive the second digital signal having the voltage amplitudes. The dual-input voltage mDPD circuit also includes a control circuit. The control circuit is configured to receive the first digital signal and the second digital signal from the first port and the second port, respectively. The control circuit is also configured to digitally pre-distort the voltage amplitudes based on the signal amplitudes to generate a digital target voltage signal having a number of target voltage amplitudes corresponding to the voltage amplitudes.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a dual-input voltage memory digital pre-distortion (mDPD) circuit and a related envelope tracking (ET) apparatus. In examples discussed herein, an ET apparatus includes an amplifier circuit(s) configured to amplify a radio frequency (RF) signal based on an ET voltage. A tracker circuit is configured to generate the ET voltage based on a number of target voltage amplitudes derived from a number of signal amplitudes of the RF signal. However, the tracker circuit can cause the ET voltage to deviate from the target voltage amplitudes due to various inherent impedance variations and/or nonlinearities of the tracker circuit and the amplifier circuit(s), particularly at a higher modulation bandwidth (e.g., 60 MHz). In this regard, a dual-input voltage mDPD circuit is configured to digitally pre-distort the target voltage amplitudes based on the signal amplitudes such that the ET voltage can closely track the target voltage amplitudes. As such, it is possible to mitigate ET voltage deviation, thus helping to improve overall linearity performance of the ET apparatus.

Figure 1A:
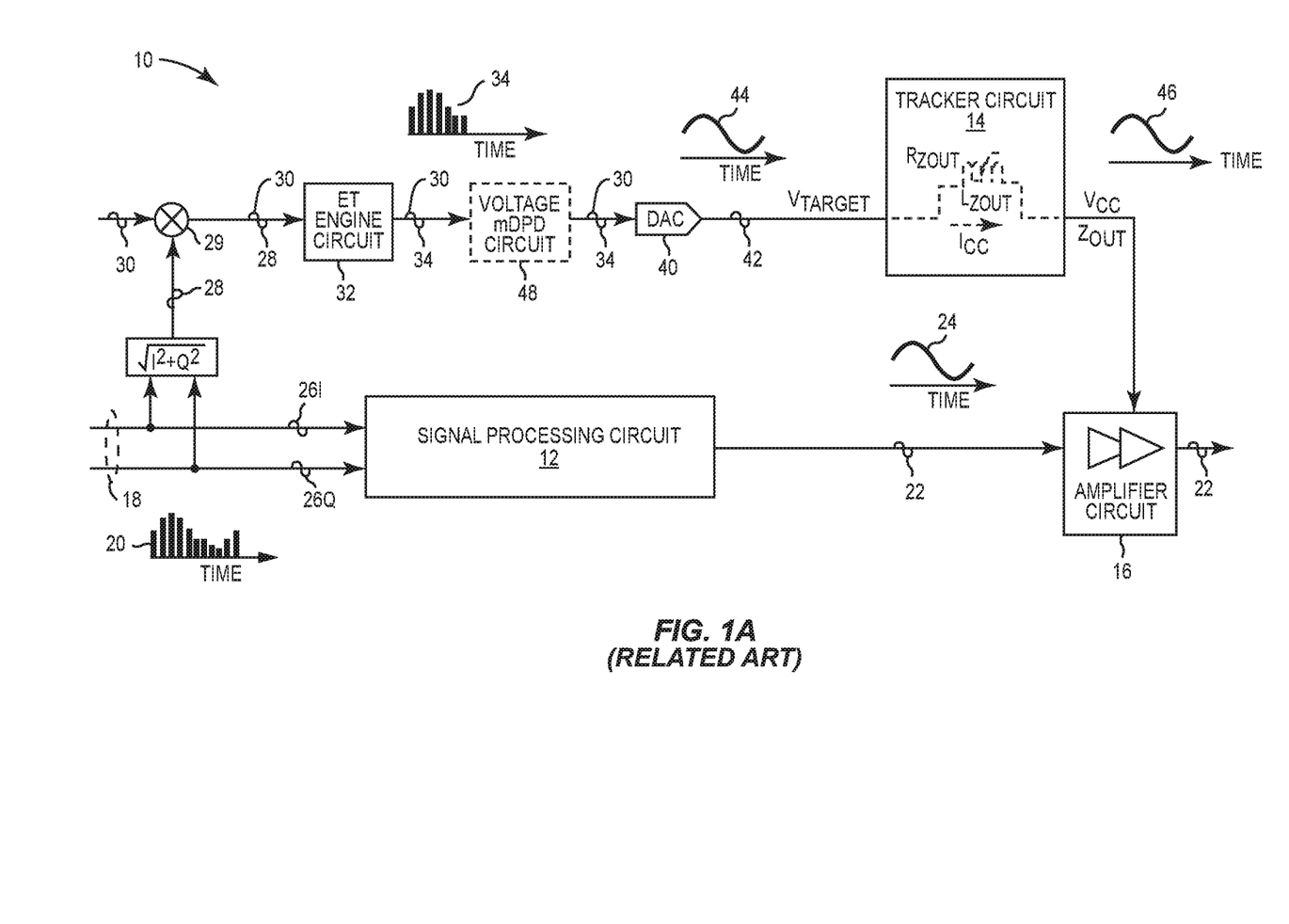
FIG. 1A is a schematic diagram of an exemplary existing envelope tracking (ET) apparatus that can experience degraded overall linearity performance as a result of ET voltage deviation.
Figure 1B:
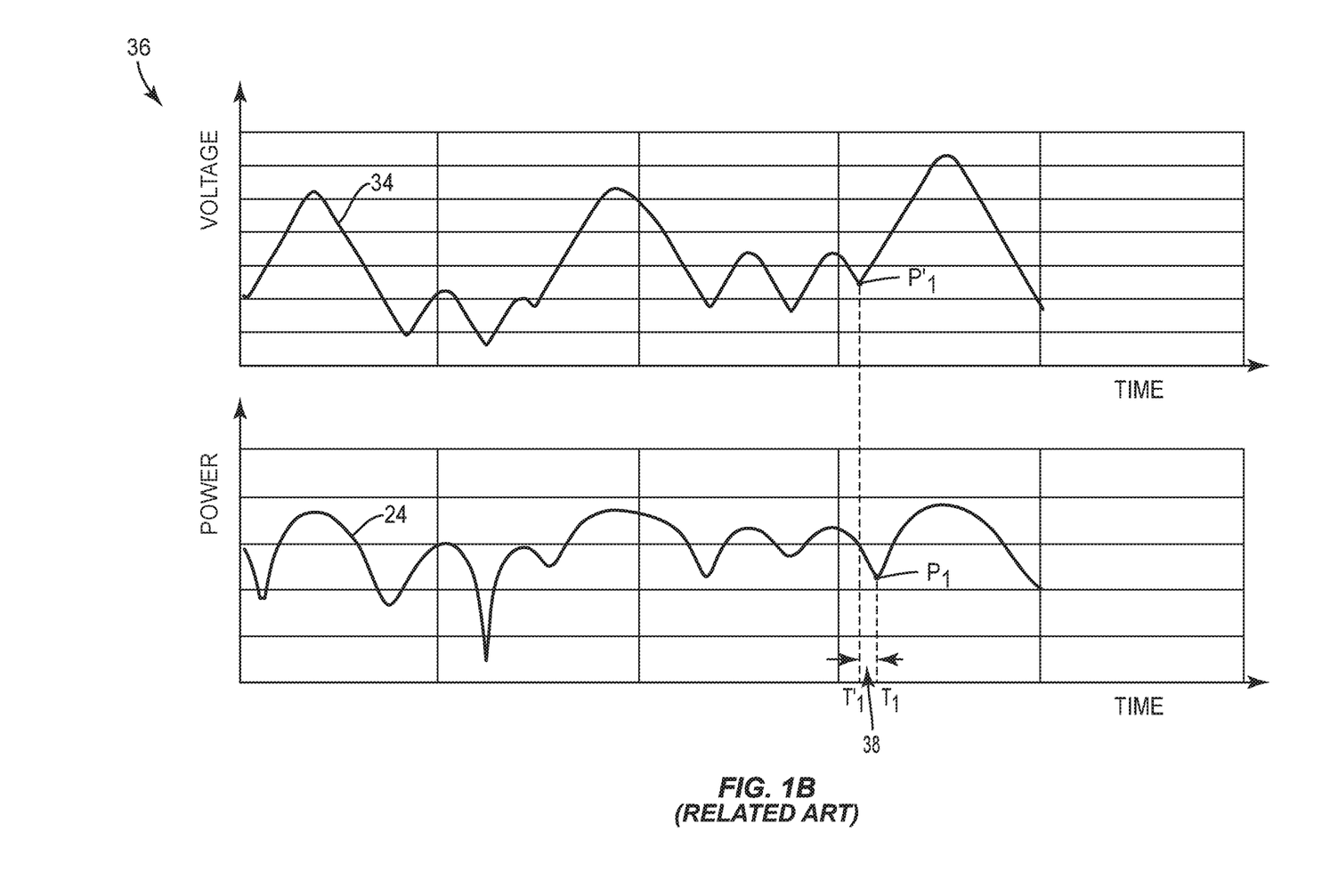
FIG. 1B is a graphic diagram providing an exemplary illustration of a misalignment(s) that may exist between a number of voltage amplitudes and a time-variant power envelope.

Before discussing the dual-input voltage mDPD circuit and the related ET apparatus of the present disclosure, a brief overview of an existing ET apparatus that may experience degraded overall linearity performance as a result of ET voltage deviation is first provided with references to FIGS. 1A and 1B. The discussion of specific exemplary aspects of using a dual-input voltage mDPD circuit to correct the ET voltage deviation in an ET apparatus starts below with reference to FIG. 2.

FIG. 1A is a schematic diagram of an exemplary existing ET apparatus 10 that can experience degraded overall linearity performance as a result of ET voltage deviation. The existing ET apparatus 10 includes a signal processing circuit 12, a tracker circuit 14, and an amplifier circuit 16. The signal processing circuit 12 receives a digital signal 18 having a number of power amplitudes 20. The signal processing circuit 12 is configured to convert the digital signal 18 into an RF signal 22 having a time-variant power envelope 24 that rises and falls according to the power amplitudes 20. In this regard, the power amplitudes 20 define the time-variant power envelope 24.

The digital signal 18 may be modulated to include a digital in-phase signal 26I, which corresponds to a number of in-phase amplitudes I, and a digital quadrature signal 26Q, which corresponds to a number of quadrature amplitudes Q. Notably, the in-phase amplitudes I and the quadrature amplitudes Q may be time-variant amplitudes that can rise and fall over time. In this regard, the power amplitudes 20 of the digital signal 18 can define a number of signal amplitudes 28 that can be expressed as $\sqrt{I^2+Q^2}$.

The existing ET apparatus 10 includes a mixer 29 that combines the signal amplitudes 28 with a digital target voltage signal 30 such that the digital target voltage signal 30 can rise and fall according to the signal amplitudes 28. The existing ET apparatus 10 includes an ET engine circuit 32, which may include a look-up table (LUT) (not shown) that stores predetermined voltage amplitude values corresponding to the signal amplitudes 28. In this regard, the ET engine circuit 32 may be configured to convert the signal amplitudes 28 into a number of voltage amplitudes 34 based on the LUT.

Notably, the ET engine circuit 32 may be inherently nonlinear and/or band-limited. In addition, the LUT may not be strictly monotonic. In addition, the LUT employed for converting the signal amplitudes 28 into the voltage amplitudes 34 may not be a simple LUT. In other words, the LUT may not be defined with sufficient granularity to correlate each of the signal amplitudes 28 with each of the voltage amplitudes 34. As a result of such digital conversion, the voltage amplitudes 34 may have a weak correlation to the signal amplitudes 28 and thus the power amplitudes 20. Consequently, the voltage amplitudes 34 may be misaligned with the signal amplitudes 28, and thus the time-variant power envelope 24. In this regard, FIG. 1B is a graphic diagram 36 providing an exemplary illustration of a misalignment(s) 38 that may exist between the voltage amplitudes 34 and the time-variant power envelope 24.

In a non-limiting example, the time-variant power envelope 24 can have a low-power point $P_1$ that appears at time $T_1$. However, as a result of the misalignment(s) 38 caused by the ET engine circuit 32 in FIG. 1A, a corresponding low-voltage amplitude $P'_1$ among the voltage amplitudes 34 appears at time $T'_1$, as opposed to appearing at the time $T_1$. The voltage amplitudes 34 are misaligned with the time-variant power envelope 24 of the RF signal 22. As a result, the amplifier circuit 16 in FIG. 1A may suffer degraded efficiency and/or linearity, thus compromising performance of the existing ET apparatus 10 of FIG. 1A.

With reference back to FIG. 1A, the existing ET apparatus 10 includes a voltage digital-to-analog converter (DAC) 40 configured to convert the digital target voltage signal 30 having the voltage amplitudes 34 into a target voltage signal 42 having a time-variant target voltage envelope 44 tracking the voltage amplitudes 34. The tracker circuit 14 is coupled to the DAC 40 to receive the target voltage signal 42 having the time-variant target voltage envelope 44. In this regard, the time-variant target voltage envelope 44 represents a target voltage $V_{TARGET}$ for the tracker circuit 14. The tracker circuit 14 is configured to generate an ET voltage $V_{CC}$ having a time-variant voltage envelope 46 that tracks the time-variant target voltage envelope 44, and thus the target voltage $V_{TARGET}$.

The amplifier circuit 16 is coupled to the signal processing circuit 12 to receive the RF signal 22 having the time-variant power envelope 24. The amplifier circuit 16 is also coupled to the tracker circuit 14 to receive the ET voltage $V_{CC}$ that tracks the time-variant target voltage envelope 44. The amplifier circuit 16 is configured to amplify the RF signal 22 based on the ET voltage $V_{CC}$. In this regard, it may be necessary for the time-variant voltage envelope 46 of the ET voltage $V_{CC}$ to track closely the time-variant target voltage envelope 44 to maintain linearity and efficiency in the amplifier circuit 16.

As discussed earlier, the ET engine circuit 32 can cause the voltage amplitudes 34 to deviate from the time-variant power envelope 24, thus causing the time-variant target voltage envelope 44 and the time-variant voltage envelope 46 to deviate from the time-variant power envelope 24 as well. In addition, the time-variant voltage envelope 46 may further deviate from the time-variant power envelope 24 due to inherent impedance $Z_{OUT}$ of the tracker circuit 14 and/or the associated load of the amplifier circuit 16.

In a non-limiting example, the inherent output impedance $Z_{OUT}$ can be modeled as being primarily determined by an output inductance $L_{ZOUT}$ and/or a resistance $R_{ZOUT}$. Impact of the output inductance $L_{ZOUT}$ on the ET modulated voltage $V_{CC}$ can be expressed in the equation (Eq. 1) on the following page.

$$V_{CC}=V_{TARGET}-L_{ZOUT}*dI_{CC}/dt-R_{ZOUT}*I_{CC} \quad \text{(Eq. 1)}$$

As shown in equation 1 above, the output inductance $L_{ZOUT}$–$R_{ZOUT}$ can further cause a voltage deviation between the target voltage $V_{TARGET}$ and the ET voltage $V_{CC}$. Notably, the voltage deviation can be worsened when the tracker circuit 14 needs to output the ET voltage $V_{CC}$ at a higher modulation bandwidth (e.g., 60 MHz) in response to the RF signal 22 being encoded with a higher number of resource blocks (RBs). As a result, the time-variant voltage envelope 46 may further deviate from the time-variant target voltage envelope 44 and thus the time-variant power envelope 24.

Moreover, the deviation between the time-variant voltage envelope 46 and the time-variant power envelope 24 may depend not only on a present input of a nonlinear circuit(s) in the existing ET apparatus 10 (e.g., the ET engine circuit 32, the tracker circuit 14, and/or the amplifier circuit 16), but also on past inputs of those nonlinear circuit(s), which is a phenomenon commonly referred to as a "memory effect." To help mitigate the memory effect in the nonlinear circuit(s), the existing ET apparatus 10 may be further configured to include a voltage mDPD circuit 48 to digitally pre-distort the voltage amplitudes 34 to overcome memory effect associated with the ET engine circuit 32, the tracker circuit 14, and/or the amplifier circuit 16.

Although the voltage mDPD circuit 48 may pre-distort the voltage amplitudes 34 to help compensate for the memory effect in the tracker circuit 14 and/or the amplifier circuit 16, the voltage mDPD circuit 48 may not be effective in correcting the misalignment(s) 38, as shown in FIG. 1B, given that the voltage mDPD circuit 48 has no knowledge about the signal amplitudes 28. As such, it may be desirable to reconfigure the voltage mDPD circuit 48 to pre-distort the voltage amplitudes 34 based on the signal amplitudes 28.

Figure 2:
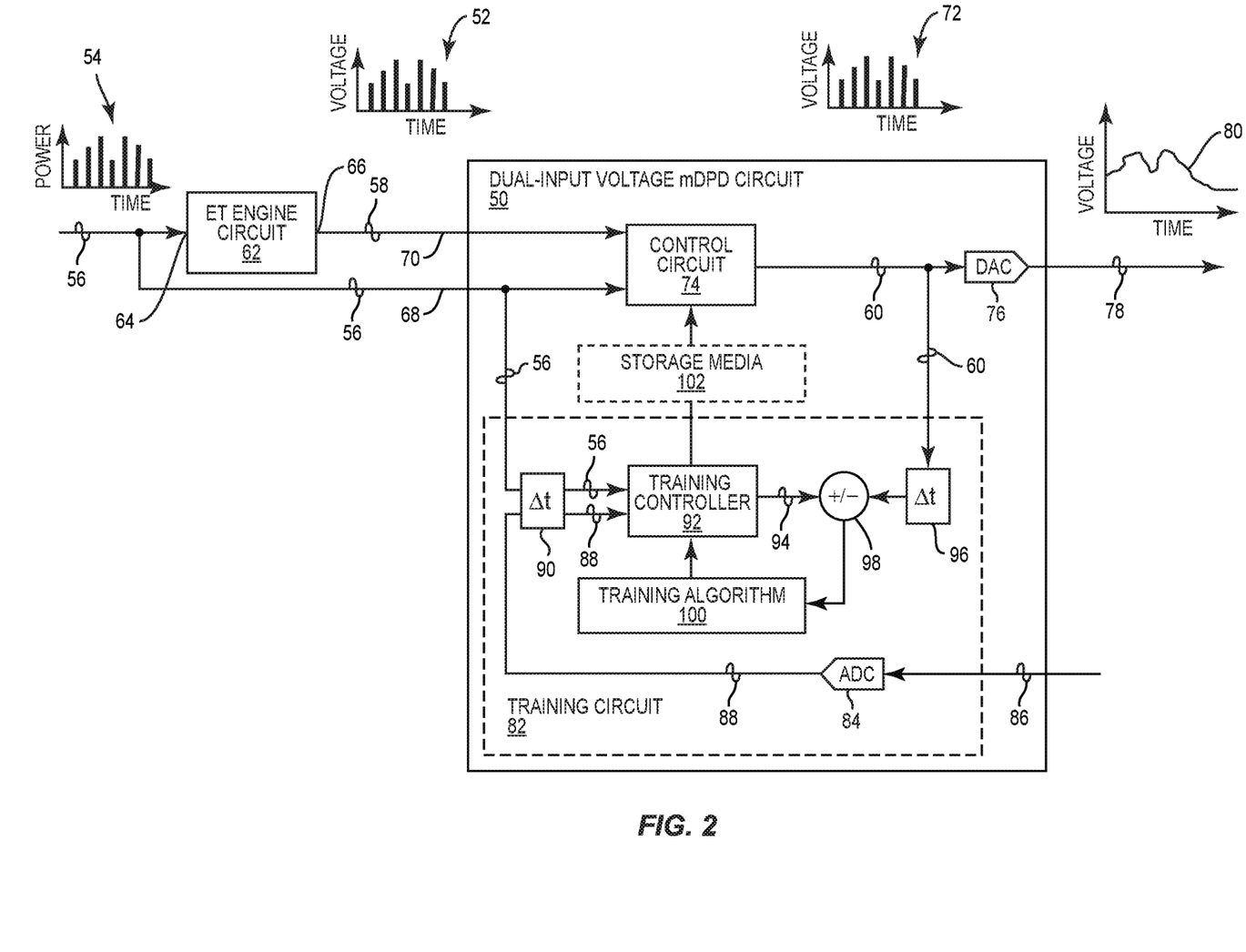
FIG. 2 is a schematic diagram of a dual-input voltage memory digital pre-distortion (mDPD) circuit configured according to an embodiment of the present disclosure to digitally pre-distort a number of voltage amplitudes based on a number of signal amplitudes.

In this regard, FIG. 2 is a schematic diagram of a dual-input voltage mDPD circuit 50 configured according to an embodiment of the present disclosure to digitally pre-distort a number of voltage amplitudes 52 based on a number of signal amplitudes 54. The dual-input voltage mDPD circuit 50 receives a first digital signal 56 and a second digital signal 58 as dual inputs and generates a digital target voltage signal 60 as a single output. In this regard, the dual-input voltage mDPD circuit 50 can also be referred to as a dual-input single-output (DISO) circuit or a two-input single-output (TISO) circuit.

The dual-input voltage mDPD circuit 50 can be coupled to an ET engine circuit 62, which is functionally equivalent to the ET engine circuit 32 in FIG. 1A. The ET engine circuit 62 has an input node 64 configured to receive the first digital signal 56 and an output node 66 configured to output the second digital signal 58. The first digital signal 56 and the second digital signal 58 are so generated to have the signal amplitudes 54 and the voltage amplitudes 52, respectively. Like the ET engine circuit 32 in FIG. 1A, the ET engine circuit 62 is configured to convert the signal amplitudes 54 to the voltage amplitudes 52 based on, for example an LUT (not shown).

The dual-input voltage mDPD circuit 50 may include a first port 68 and a second port 70 coupled to the input node 64 and the output node 66, respectively. In contrast to the voltage mDPD circuit 48 in FIG. 1A, which only receives the voltage amplitudes 34, the dual-input voltage mDPD circuit 50 is configured to receive the signal amplitudes 54 in addition to the voltage amplitudes 52. In this regard, the dual-input voltage mDPD circuit 50 can digitally pre-distort the voltage amplitudes 52 based on the signal amplitudes 54 to generate a number of target voltage amplitudes 72 in the digital target voltage signal 60. With additional knowledge in the signal amplitudes 54, the dual-input voltage mDPD circuit 50 may overcome the deficiency of the voltage mDPD circuit 48 in FIG. 1A, thus helping to reduce distortions in the ET voltage $V_{CC}$ caused by misalignments between the target voltage amplitudes 72 and the signal amplitudes 54. For example, the target voltage amplitudes 72 can stay constant while the signal amplitudes 54 change due to misalignments between the target voltage amplitudes 72 and the signal amplitudes 54. As a result, the ET voltage $V_{CC}$ may not increase and/or decrease in accordance to the signal amplitudes 54.

The dual-input voltage mDPD circuit 50 can be configured to include a control circuit 74, which can be a microprocessor, a microcontroller, a field-programmable gate array (FPGA), or a combination thereof. In a non-limiting example, the control circuit 74 is configured to receive the first digital signal 56 and the second digital signal 58 and generate the digital target voltage signal 60 based on the first digital signal 56 and the second digital signal 58. In this regard, the control circuit 74 is configured to generate the target voltage amplitudes 72 based on the voltage amplitudes 52 and the signal amplitudes 54. In examples discussed herein, the control circuit 74 can be configured to execute a dual-input memory polynomial to digitally pre-distort the voltage amplitudes 52 such that a misalignment(s), such as the misalignment(s) 38 in FIG. 1B, between the voltage amplitudes 52 and the signal amplitudes 54 can be corrected and/or compensated in the target voltage amplitudes 72.

The Volterra series is a known formation that can be used to generate a single output y based on two inputs $x_1$ and $x_2$. A general formation of the Volterra series is shown below in the equation (Eq. 2).

$$y[n] = \begin{bmatrix} K_0 + \sum_{j_1=1}^{2}\left(\sum_{k_1=0}^{N} K_{1,k_1}^{j_1} \cdot x_{j_1}[n-k_1]\right) + \\ \sum_{j_1=1}^{2}\sum_{j_2=1}^{2}\left(\sum_{k_1=0}^{N}\sum_{k_2=0}^{N} K_{2,k_1,k_2}^{j_1,j_2} \cdot x_{j_1}[n-k_1] \cdot x_{j_2}[n-k_2]\right) + \\ \ldots + \\ \sum_{j_1=1}^{2}\ldots\sum_{j_O=1}^{2}\left(\sum_{k_1=0}^{N}\ldots\sum_{k_O=0}^{N} K_{O,k_1,\ldots,k_o}^{j_1,\ldots,j_o} \cdot \prod_{o=1}^{O} x_{j_o}[n-k_o]\right) \end{bmatrix} \quad \text{(Eq. 2)}$$

In the Volterra series formation above, the K . . . coefficients are referred to as Volterra kernels. $K_0$ represents an offset term. $K_{1,k_1}^{j_1}$ are first order terms representing linear contribution of each input $x_1$ and $x_2$ in the system response, which also includes frequency dependency similar to small signal frequency response. $K_{2,k_1,k_2}^{j_1,j_2} \ldots K_{O,k_1,\ldots,k_o}^{j_1,\ldots,j_o} \ldots K_{O,k_1,\ldots,k_o}^{j_1,\ldots,j_o}$ are the second and highest order terms that add non-linear contributions to individual paths ($j_1 = \ldots = j_o$) of the inputs $x_1$ and $x_2$ as well as deep interaction between the individual paths (also referred to as "cross coupled" terms).

Notably, the general formation of the Volterra series as shown in equation 2 may be overly complex for any practical implementation. As such, several simplified dual-input memory polynomials can be defined to enable the control circuit 74 to digitally pre-distort the voltage amplitudes 52 based on the signal amplitudes 54. In examples discussed herein, the signal amplitudes 54 can be used as the input $x_1$ and the voltage amplitudes 52 can be used as the input $x_2$ in the simplified dual-input memory polynomials discussed below.

In a first non-limiting example, a non-coupled memory polynomial (NCMP) can be defined and expressed in the equation (Eq. 3) below.

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \sum_{k=0}^{N_2} K_k^{0,1} \cdot x_2[n-k] + \\ \sum_{k=0}^{N_2} K_k^{0,2} \cdot x_2^2[n-k] + \ldots + \sum_{k=0}^{N_2} K_k^{0,O_2} \cdot x_2^{O_2}[n-k] \end{bmatrix} \quad \text{(Eq. 3)}$$

The NCMP models non-linear and memory components of respective paths of the signal amplitudes 54 ($x_1$) and the voltage amplitudes 52 ($x_2$) independently using two memory polynomials. In equation 3 above, $O_1$ and $O_2$ represent order terms of the respective path of the first input $x_1$ and the respective path of the second input $x_2$, respectively. $N_1$ and $N_2$ represent memory depth of the respective path of the first input $x_1$ and the respective path of the second input $x_2$, respectively. The NCMP may represent an extreme simplification of the Volterra series, which assumes $O_1 \neq O_2$ and $N_1 \neq N_2$. As shown in equation 3, the NCMP only keeps non-cross coupled terms (e.g., $j_1 = j_2$) and diagonal terms (e.g., $k_1 = \ldots = k_o$). The NCMP is advantageous over the Volterra series in simplicity. However, the NCMP does not include cross coupled terms that are required to model interactions between the voltage amplitudes 52 and the signal amplitudes 54.

In this regard, in a second non-limiting example, a cross coupled memory polynomial (CCMP) can be defined and expressed in the equation (Eq. 4) below.

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \sum_{k=0}^{N_2} K_k^{0,1} \cdot x_2[n-k] + \\ \sum_{k=0}^{N_2} K_k^{0,2} \cdot x_2^2[n-k] + \ldots + \sum_{k=0}^{N_2} K_k^{0,O_2} \cdot x_2^{O_2}[n-k] + \\ \sum_{k=0}^{N} K_k^{1,1} \cdot x_1[n-k] \cdot x_2[n-k] + \\ \sum_{k=0}^{N} K_k^{1,2} \cdot x_1[n-k] \cdot x_2^2[n-k] + \\ \sum_{k=0}^{N} K_k^{2,1} \cdot x_1^2[n-k] \cdot x_2[n-k] + \ldots + \\ \sum_{k=0}^{N} K_k^{1,O-1} \cdot x_1[n-k] \cdot x_2^{O-1}[n-k] + \ldots + \\ \sum_{k=0}^{N} K_k^{O-1,1} \cdot x_1^{O-1}[n-k] \cdot x_2[n-k] \end{bmatrix} \quad \text{(Eq. 4)}$$

The CCMP in equation 4 includes extra cross coupled terms compared to the NCMP in equation 3. In contrast to the NCMP, the CCMP assumes $j_1 \neq j_2$. The CCMP has the ability to model interactions between the voltage amplitudes 52 and the signal amplitudes 54. However, the CCMP may still lack the ability of modeling "cross memory effects" between the voltage amplitudes 52 and the signal amplitudes 54.

In this regard, in a third non-limiting example, a generalized cross coupled memory polynomial (GCCMP) can be defined and expressed in the equation (Eq. 5) below.

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \sum_{k=0}^{N_2} K_k^{0,1} \cdot x_2[n-k] + \\ \sum_{k=0}^{N_2} K_k^{0,2} \cdot x_2^2[n-k] + \ldots + \sum_{k=0}^{N_2} K_k^{0,O_2} \cdot x_2^{O_2}[n-k] + \\ \sum_{k=0}^{N} K_k^{1,1} \cdot x_1[n-k] \cdot x_2[n-k] + \\ \sum_{k=0}^{N} K_k^{1,2} \cdot x_1[n-k] \cdot x_2^2[n-k] + \\ \sum_{k=0}^{N} K_k^{2,1} \cdot x_1^2[n-k] \cdot x_2[n-k] + \ldots + \\ \sum_{k=0}^{N} K_k^{1,O-1} \cdot x_1[n-k] \cdot x_2^{O-1}[n-k] + \ldots + \\ \sum_{k=0}^{N} K_k^{O-1,1} \cdot x_1^{O-1}[n-k] \cdot x_2[n-k] \end{bmatrix} \quad \text{(Eq. 5)}$$

Compared to the CCMP, the GCCMP further includes cross memory terms. As such, the GCCMP is capable of modeling the "cross memory effects" between the voltage amplitudes 52 and the signal amplitudes 54 in addition to the interactions between the voltage amplitudes 52 and the signal amplitudes 54.

Notably, the CCMP has an improved modeling precision over the NCMP and the GCCMP has an improved modeling precision over the CCMP. As such, the NCMP, the CCMP, and the GCCMP can be selectively adopted by the dual-input voltage mDPD circuit 50 based on the system to be pre-distorted. For a system with a higher degree of nonlinearity and/or memory effect, it may be ideal for the dual-input voltage mDPD circuit 50 to employ the GCCMP. In contrast, for a system with a lower degree of nonlinearity and/or memory effect, it may be better off for the dual-input voltage mDPD circuit 50 to employ the NCMP or the CCMP for the sake of computational simplicity.

With continuing reference to FIG. 2, the dual-input voltage mDPD circuit 50 may include a DAC 76 configured to convert the digital target voltage signal 60 into an analog target voltage signal 78 having a time-variant target voltage envelope 80 that corresponds to the target voltage amplitudes 72. By digitally pre-distorting the voltage amplitudes 52 based on the signal amplitudes 54, the time-variant target voltage envelope 80 may be in better conformance to the signal amplitudes 54.

Notably, the NCMP, the CCMP, and GCCMP each includes a number of parameters that may be fine-tuned through a training process. In this regard, the dual-input voltage mDPD circuit 50 may include a training circuit 82 configured to calibrate and/or fine-tune the dual-input memory polynomial such as the NCMP, the CCMP, or the GCCMP.

The training circuit 82 may include an analog-to-digital converter (ADC) 84. The ADC 84 can be configured to receive and convert an analog voltage feedback signal 86 into a digital voltage feedback signal 88. In a non-limiting example, the analog voltage feedback signal 86 is configured to provide an indication of an ET voltage that is generated based on the analog target voltage signal 78. The training circuit 82 may include timing adjustment circuitry 90. The timing adjustment circuitry 90 receives the digital voltage feedback signal 88 and the signal amplitudes 54. In a non-limiting example, the timing adjustment circuitry 90 synchronizes the signal amplitudes 54 with the digital voltage feedback signal 88. The training circuit 82 may include a training controller 92 coupled to the timing adjustment circuitry 90 to receive the first digital signal 56, which includes the signal amplitudes 54, and the digital voltage feedback signal 88. The training controller 92 may be configured to generate a signal 94 that provides an indication on how the ET voltage is aligned with the signal amplitudes 54. The training circuit 82 may include second timing adjustment circuitry 96 configured to receive and perform timing adjustment on the digital target voltage signal 60, which includes the target voltage amplitudes 72. The training circuit 82 may include a combiner 98 that combines the signal 94 with the digital target voltage signal 60 to fine-tune a training algorithm 100 (e.g., NCMP, CCMP, or GCCMP). The training process continues until the training controller 92 determines that the training algorithm 100 has been calibrated to render a desired result. At this point, the training controller 92 may store the training algorithm 100 in a storage media 102 (e.g., memory, register, flash media, etc.) to be used by the control circuit 74.

Figure 3:
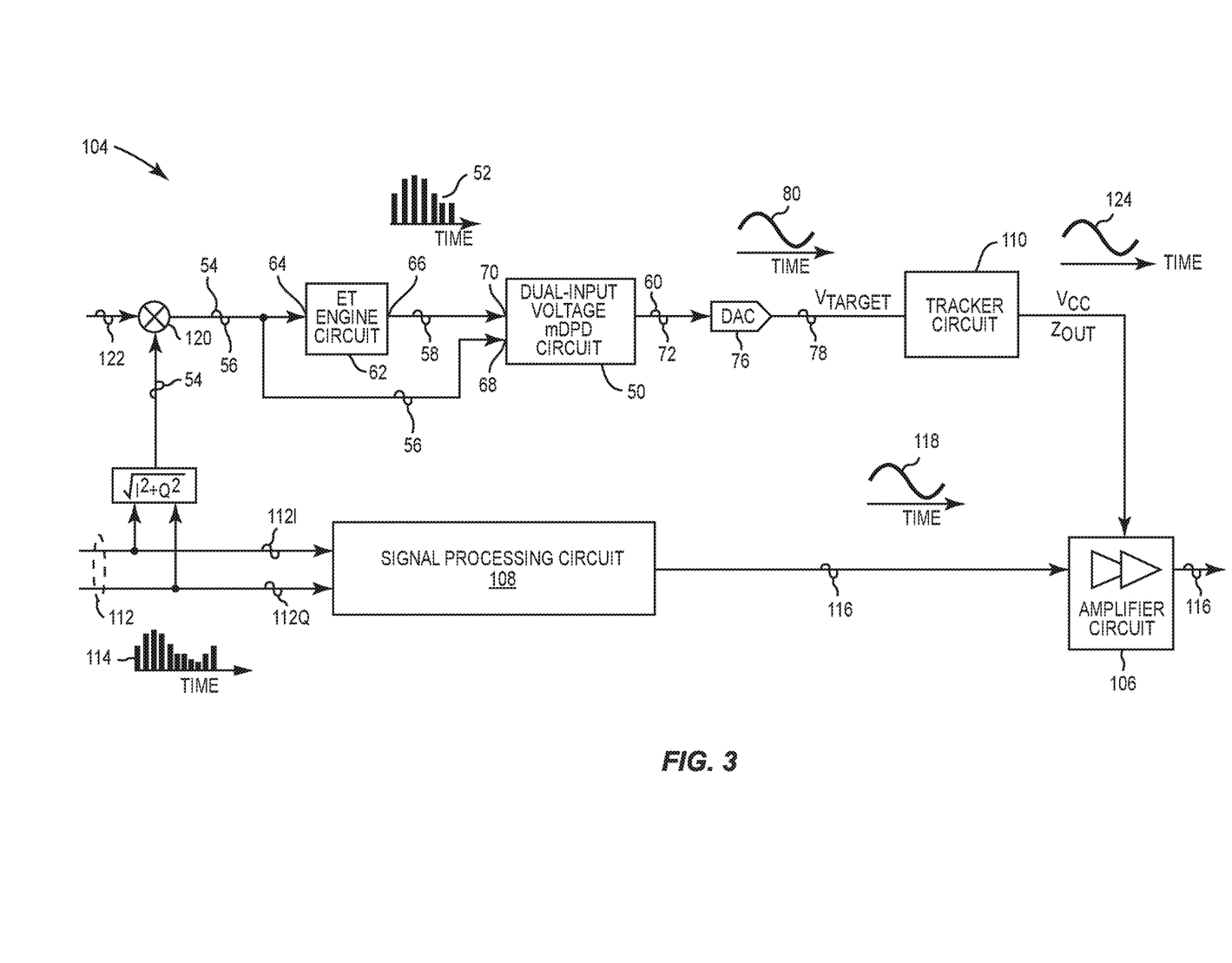
FIG. 3 is a schematic diagram of an exemplary ET apparatus configured according to an embodiment of the present disclosure to incorporate the dual-input voltage mDPD circuit of FIG. 2 to help improve RF performance of an amplifier circuit.

The dual-input voltage mDPD circuit 50 can be provided in an ET apparatus to help improve such RF performance measures as adjacent channel leakage ratio (ACLR), error vector magnitude (EVM), and so on. In this regard, FIG. 3 is a schematic diagram of an exemplary ET apparatus 104 configured according to an embodiment of the present disclosure to incorporate the dual-input voltage mDPD circuit 50 of FIG. 2 to help improve RF performance of an amplifier circuit 106. Common elements between FIGS. 2 and 3 are shown therein with common element numbers and will not be re-described herein.

The ET apparatus 104 includes a signal processing circuit 108 and a tracker circuit 110. The signal processing circuit 108 receives a digital signal 112 having a number of power amplitudes 114. The signal processing circuit 108 is configured to convert the digital signal 112 into an RF signal 116 having a time-variant power envelope 118 that rises and falls according to the power amplitudes 114. In this regard, the power amplitudes 114 define the time-variant power envelope 118.

The digital signal 112 may be modulated to include a digital in-phase signal 112I, which corresponds to a number of in-phase amplitudes I, and a digital quadrature signal 112Q, which corresponds to a number of quadrature amplitudes Q. Notably, the in-phase amplitudes I and the quadrature amplitudes Q may be time-variant amplitudes that can rise and fall over time. In this regard, the power amplitudes 114 of the digital signal 112 can define the signal amplitudes 54, which can be expressed as $\sqrt{I^2+Q^2}$. The ET apparatus 104 includes a mixer 120 that combines the signal amplitudes 54 with a digital reference signal 122 to generate the first digital signal 56 having the signal amplitudes 54.

The ET apparatus 104 includes the ET engine circuit 62, which may include an LUT (not shown) that stores predetermined voltage amplitude values corresponding to the signal amplitudes 54. In this regard, the ET engine circuit 62 may be configured to convert the signal amplitudes 54 into the voltage amplitudes 52 based on the LUT. Accordingly, the ET engine circuit 62 generates the second digital signal 58 having the voltage amplitudes 52.

The ET apparatus 104 includes the dual-input voltage mDPD circuit 50 configured to generate the digital target voltage signal 60 based on the first digital signal 56 and the second digital signal 58. The ET apparatus 104 includes the DAC 76 configured to convert the digital target voltage signal 60 into the analog target voltage signal 78 having the time-variant target voltage envelope 80 tracking the target voltage amplitudes 72.

The tracker circuit 110 is coupled to the DAC 76 to receive the analog target voltage signal 78 having the time-variant target voltage envelope 80. In this regard, the time-variant target voltage envelope 80 represents a target voltage $V_{TARGET}$ for the tracker circuit 110. The tracker circuit 110 is configured to generate an ET voltage $V_{CC}$ having a time-variant voltage envelope 124 that tracks the time-variant target voltage envelope 80, and thus the target voltage $V_{TARGET}$.

The amplifier circuit 106 is coupled to the signal processing circuit 108 to receive the RF signal 116 having the time-variant power envelope 118. The amplifier circuit 106 is also coupled to the tracker circuit 110 to receive the ET voltage $V_{CC}$ that tracks the time-variant target voltage envelope 80. The amplifier circuit 106 is configured to amplify the RF signal 116 based on the ET voltage $V_{CC}$.

Figure 4:
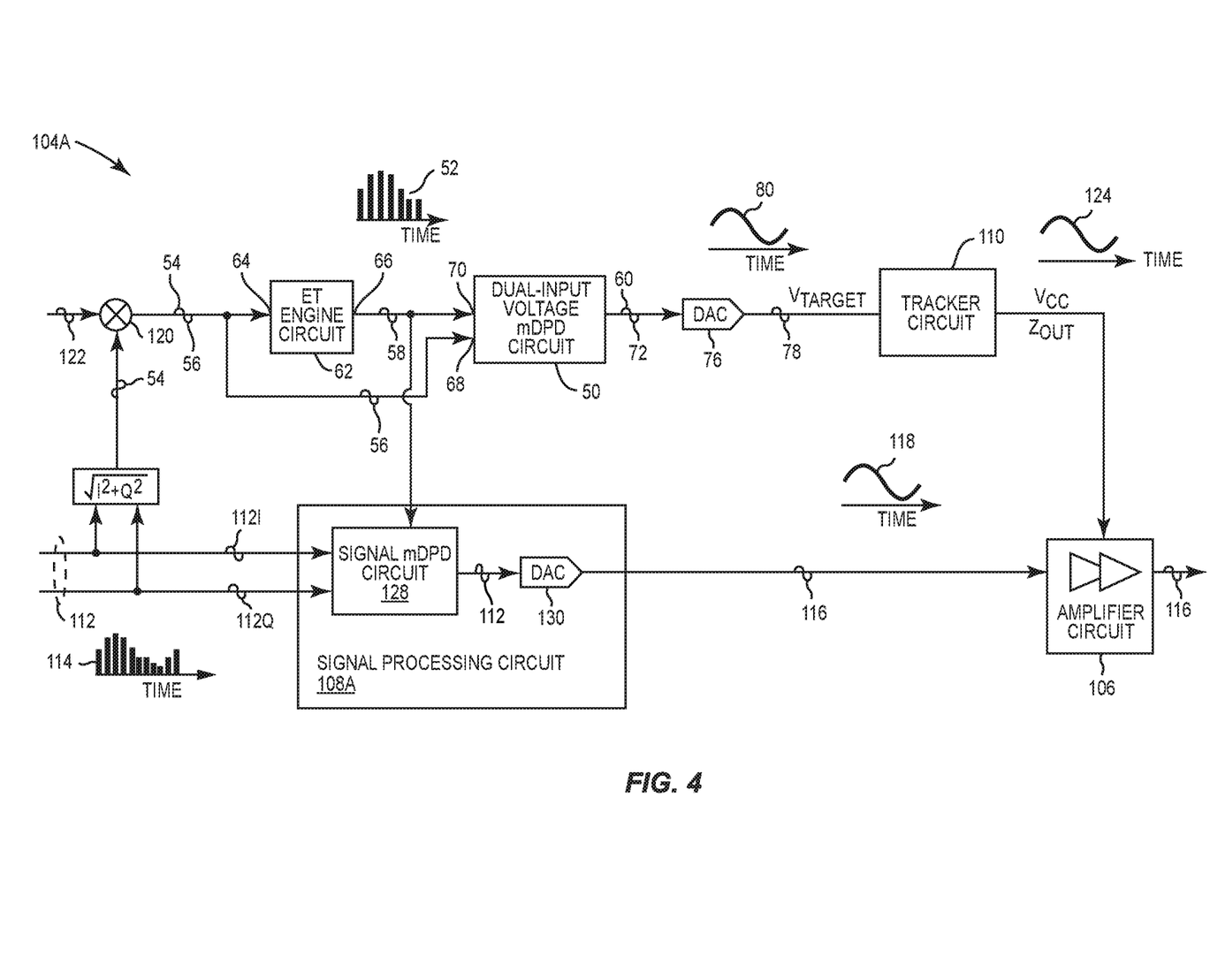
FIG. 4 is a schematic diagram of an exemplary ET apparatus configured according to another embodiment of the present disclosure to incorporate the dual-input voltage mDPD circuit of FIG. 2.

FIG. 4 is a schematic diagram of an exemplary ET apparatus 104A configured according to another embodiment of the present disclosure to incorporate the dual-input voltage mDPD circuit 50 of FIG. 2. Common elements between FIGS. 3 and 4 are shown therein with common element numbers and will not be re-described herein.

The ET apparatus 104A includes a signal processing circuit 108A. The signal processing circuit 108A includes a signal mDPD circuit 128. The signal mDPD circuit 128 receives the digital signal 112 and the voltage amplitudes 52 in the second digital signal 58. Accordingly, the signal mDPD circuit 128 is configured to digitally pre-distort the digital signal 112 based on the voltage amplitudes 52 to further compensate for nonlinear distortion caused by the amplifier circuit 106. The signal processing circuit 108A also includes a signal DAC 130. The signal DAC 130 is configured to convert the digital signal 112 into the RF signal 116.

Those skilled in the art will recognize improvements and modifications to the embodiments of the present disclosure. All such improvements and modifications are considered within the scope of the concepts disclosed herein and the claims that follow.

What is claimed is:

1. A dual-input voltage memory digital pre-distortion (mDPD) circuit comprising:
a first port coupled to an input node of an envelope tracking (ET) engine circuit to receive a first digital signal having a plurality of signal amplitudes;
a second port coupled to an output node of the ET engine circuit to receive a second digital signal having a plurality of voltage amplitudes corresponding to the plurality of signal amplitudes; and
a control circuit configured to:
receive the first digital signal and the second digital signal from the first port and the second port, respectively; and
digitally pre-distort the plurality of voltage amplitudes based on the plurality of signal amplitudes to generate a digital target voltage signal having a plurality of target voltage amplitudes corresponding to the plurality of voltage amplitudes.

2. The dual-input voltage mDPD circuit of claim 1 wherein the control circuit is further configured to digitally pre-distort the plurality of voltage amplitudes based on the plurality of signal amplitudes to correct one or more misalignments between the plurality of voltage amplitudes and the plurality of signal amplitudes in the plurality of target voltage amplitudes.

3. The dual-input voltage mDPD circuit of claim 1 wherein the control circuit is further configured to execute a dual-input memory polynomial to digitally pre-distort the plurality of voltage amplitudes based on the plurality of signal amplitudes.

4. The dual-input voltage mDPD circuit of claim 3 wherein the dual-input memory polynomial is a non-coupled memory polynomial (NCMP) expressed as:

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \\ \sum_{k=0}^{N_2} K_k^{0,1} \cdot x_2[n-k] + \sum_{k=0}^{N_2} K_k^{0,2} \cdot x_2^2[n-k] + \ldots + \\ \sum_{k=0}^{N_2} K_k^{0,O_2} \cdot x_2^{O_2}[n-k] \end{bmatrix},$$

wherein:
y[n] represents a single output of a Volterra series;
$x_1$ and $x_2$ represent two inputs of the Volterra series;
K represents a kernel of the Volterra series;
$K_0$ represents an offset term; and
$O_1$ and $O_2$ represent order terms of a respective path of a first input $x_1$ and a respective path of a second input $x_2$, respectively.

5. The dual-input voltage mDPD circuit of claim 3 wherein the dual-input memory polynomial is a cross coupled memory polynomial (CCMP) expressed as:

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \\ \sum_{k=0}^{N_2} K_k^{0,1} \cdot x_2[n-k] + \sum_{k=0}^{N_2} K_k^{0,2} \cdot x_2^2[n-k] + \ldots + \\ \sum_{k=0}^{N_2} K_k^{0,O_2} \cdot x_2^{O_2}[n-k] + \\ \sum_{k=0}^{N} K_k^{1,1} \cdot x_1[n-k] \cdot x_2[n-k] + \\ \sum_{k=0}^{N} K_k^{1,2} \cdot x_1[n-k] \cdot x_2^2[n-k] + \\ \sum_{k=0}^{N} K_k^{2,1} \cdot x_1^2[n-k] \cdot x_2[n-k] + \ldots + \\ \sum_{k=0}^{N} K_k^{1,O-1} \cdot x_1[n-k] \cdot x_2^{O-1}[n-k] + \ldots + \\ \sum_{k=0}^{N} K_k^{O-1,1} \cdot x_1^{O-1}[n-k] \cdot x_2[n-k] \end{bmatrix},$$

wherein:
y[n] represents a single output of a Volterra series;
$x_1$ and $x_2$ represent two inputs of the Volterra series;
K represents a kernel of the Volterra series;
$K_0$ resents an offset term; and
$O_1$ and $O_2$ represent order terms of a respective path of a first input $x_1$ and a respective path of a second input $x_2$, respectively.

6. The dual-input voltage mDPD circuit of claim 3 wherein the dual-input memory polynomial is a generalized cross coupled memory polynomial (GCCMP) expressed as:

$$y[n] = \begin{bmatrix} K_{0,0}^{0,0} + \sum_{k=0}^{N_1} K_{k,0}^{1,0} \cdot x_1[n-k] + \sum_{k=0}^{N_1} K_{k,0}^{2,0} \cdot x_1^2[n-k] + \ldots + \\ \sum_{k=0}^{N_1} K_{k,0}^{O_1,0} \cdot x_1^{O_1}[n-k] + \\ \sum_{k=0}^{N_2} K_{0,k}^{0,1} \cdot x_2[n-k] + \sum_{k=0}^{N_2} K_{0,k}^{0,2} \cdot x_2^2[n-k] + \ldots + \\ \sum_{k=0}^{N_2} K_{0,k}^{0,O_2} \cdot x_2^{O_2}[n-k] + \\ \sum_{[k_1,k_2] \in K_{12}} K_{k_1,k_2}^{1,1} \cdot x_1[n-k_1] \cdot x_2[n-k_2] + \\ \sum_{[k_1,k_2] \in K_{12}} K_{k_1,k_2}^{1,2} \cdot x_1[n-k_1] \cdot x_2^2[n-k_2] + \\ \sum_{[k_1,k_2] \in K_{12}} K_{k_1,k_2}^{2,1} \cdot x_1^2[n-k_1] \cdot x_2[n-k_2] + \ldots + \\ \sum_{[k_1,k_2] \in K_{12}} K_{k_1,k_2}^{1,O-1} \cdot x_1[n-k_1] \cdot x_2^{O-1}[n-k_2] + \ldots + \\ \sum_{[k_1,k_2] \in K_{12}} K_{k_1,k_2}^{O-1,1} \cdot x_1^{O-1}[n-k_1] \cdot x_2[n-k_2] \end{bmatrix},$$

wherein:
y[n] represents a single output of a Volterra series;
$x_1$ and $x_2$ represent two inputs of the Volterra series;
K represents a kernel of the Volterra series;
$K_0$ represents an offset term; and
$O_1$ and $O_2$ represent order terms of a respective path of a first input $x_1$ and a respective path of a second input $x_2$, respectively.

7. The dual-input voltage mDPD circuit of claim 3 further comprising a training circuit configured to calibrate the dual-input memory polynomial based on a digital voltage feedback signal.

8. The dual-input voltage mDPD circuit of claim 7 wherein the training circuit comprises:
an analog-to-digital converter (ADC) configured to receive and convert an analog voltage feedback signal into the digital voltage feedback signal;
timing adjustment circuitry configured to synchronize the plurality of signal amplitudes with the digital voltage feedback signal; and
a training controller configured to calibrate the dual-input memory polynomial based on the plurality of signal amplitudes, the plurality of target voltage amplitudes, and the digital voltage feedback signal.

9. The dual-input voltage mDPD circuit of claim 1 further comprising a digital-to-analog converter (DAC) configured to convert the digital target voltage signal into an analog target voltage signal having a time-variant target voltage envelope corresponding to the plurality of target voltage amplitudes.

10. An envelope tracking (ET) apparatus comprising:
an ET engine circuit comprising:
an input node configured to receive a first digital signal having a plurality of signal amplitudes; and
an output node configured to output a second digital signal having a plurality of voltage amplitudes corresponding to the plurality of signal amplitudes; and
a dual-input voltage memory digital pre-distortion (mDPD) circuit comprising:
a first port coupled to the input node of the ET engine circuit to receive the first digital signal having the plurality of signal amplitudes;
a second port coupled to the output node of the ET engine circuit to receive the second digital signal having the plurality of voltage amplitudes; and
a control circuit configured to:
receive the first digital signal and the second digital signal from the first port and the second port, respectively; and
digitally pre-distort the plurality of voltage amplitudes based on the plurality of signal amplitudes to generate a digital target voltage signal having a plurality of target voltage amplitudes corresponding to the plurality of voltage amplitudes.

11. The ET apparatus of claim 10 wherein the dual-input voltage mDPD circuit further comprises a digital-to-analog converter (DAC) configured to convert the digital target voltage signal into an analog target voltage signal having a time-variant target voltage envelope corresponding to the plurality of target voltage amplitudes.

12. The ET apparatus of claim 11 further comprising:
a tracker circuit configured to generate an ET voltage based on the analog target voltage signal, the ET voltage having a time-variant voltage envelope corresponding to the time-variant target voltage envelope; and
an amplifier circuit configured to amplify a radio frequency (RF) signal based on the ET voltage.

13. The ET apparatus of claim 12 further comprising a signal processing circuit configured to:
receive a digital signal having a plurality of power amplitudes;
generate the first digital signal having the plurality of signal amplitudes corresponding to the plurality of power amplitudes;
provide the first digital signal to the ET engine circuit;
convert the digital signal into the RF signal having a time-variant power envelope corresponding to the plurality of power amplitudes; and
provide the RF signal to the amplifier circuit.

14. The ET apparatus of claim 13 wherein the signal processing circuit comprises a signal mDPD circuit configured to:
receive the digital signal;
receive the second digital signal from the output node of the ET engine circuit; and
digitally pre-distort the plurality of power amplitudes in the digital signal based on the plurality of voltage amplitudes in the second digital signal.

15. The ET apparatus of claim 10 wherein the control circuit is further configured to digitally pre-distort the plurality of voltage amplitudes based on the plurality of signal amplitudes to correct one or more misalignments between the plurality of voltage amplitudes and the plurality of signal amplitudes in the plurality of target voltage amplitudes.

16. The ET apparatus of claim 10 wherein the control circuit is further configured to execute a dual-input memory polynomial to digitally pre-distort the plurality of voltage amplitudes based on the plurality of signal amplitudes.

17. The ET apparatus of claim 16 wherein the dual-input memory polynomial is a non-coupled memory polynomial (NCMP) expressed as:

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \\ \sum_{k=0}^{N_2} K_k^{0,1} \cdot x_2[n-k] + \sum_{k=0}^{N_2} K_k^{0,2} \cdot x_2^2[n-k] + \ldots + \\ \sum_{k=0}^{N_2} K_k^{0,O_2} \cdot x_2^{O_2}[n-k] \end{bmatrix},$$

wherein:
- y[n] represents a single output of a Volterra series;
- $x_1$ and $x_2$ represent two inputs of the Volterra series;
- K represents a kernel of the Volterra series;
- $K_0$ represents an offset term; and
- $O_1$ and $O_2$ represent order terms of a respective path of a first input $x_1$ and a respective path of a second input $x_2$, respectively.

18. The ET apparatus of claim 16 wherein the dual-input memory polynomial is a cross coupled memory polynomial (CCMP) expressed as:

$$y[n] = \begin{bmatrix} K_0^{0,0} + \sum_{k=0}^{N_1} K_k^{1,0} \cdot x_1[n-k] + \sum_{k=0}^{N_1} K_k^{2,0} \cdot x_1^2[n-k] + \ldots + \\ \sum_{k=0}^{N_1} K_k^{O_1,0} \cdot x_1^{O_1}[n-k] + \\ \sum_{k=0}^{N_2} K_k^{0,1} \cdot x_2[n-k] + \sum_{k=0}^{N_2} K_k^{0,2} \cdot x_2^2[n-k] + \ldots + \\ \sum_{k=0}^{N_2} K_k^{0,O_2} \cdot x_2^{O_2}[n-k] + \\ \sum_{k=0}^{N} K_k^{1,1} \cdot x_1[n-k] \cdot x_2[n-k] + \\ \sum_{k=0}^{N} K_k^{1,2} \cdot x_1[n-k] \cdot x_2^2[n-k] + \\ \sum_{k=0}^{N} K_k^{2,1} \cdot x_1^2[n-k] \cdot x_2[n-k] + \ldots + \\ \sum_{k=0}^{N} K_k^{1,O-1} \cdot x_1[n-k] \cdot x_2^{O-1}[n-k] + \ldots + \\ \sum_{k=0}^{N} K_k^{O-1,1} \cdot x_1^{O-1}[n-k] \cdot x_2[n-k] \end{bmatrix},$$

wherein:
- y[n] represents a single output of a Volterra series;
- $x_1$ and $x_2$ represent two inputs of the Volterra series;
- K represents a kernel of the Volterra series;
- $K_0$ represents an offset term; and
- $O_1$ and $O_2$ represent order terms of a respective path of a first input $x_1$ and a respective path of a second input $x_2$, respectively.

19. The ET apparatus of claim 16 wherein the dual-input memory polynomial is a generalized cross coupled memory polynomial (GCCMP) expressed as:

$$y[n] = \begin{bmatrix} K_{0,0}^{0,0} + \sum_{k=0}^{N_1} K_{k,0}^{1,0} \cdot x_1[n-k] + \sum_{k=0}^{N_1} K_{k,0}^{2,0} \cdot x_1^2[n-k] + \ldots + \\ \sum_{k=0}^{N_1} K_{k,0}^{O_1,0} \cdot x_1^{O_1}[n-k] + \\ \sum_{k=0}^{N_2} K_{0,k}^{0,1} \cdot x_2[n-k] + \sum_{k=0}^{N_2} K_{0,k}^{0,2} \cdot x_2^2[n-k] + \ldots + \\ \sum_{k=0}^{N_2} K_{0,k}^{0,O_2} \cdot x_2^{O_2}[n-k] + \\ \sum_{[k_1,k_2]\in K_{12}} K_{k_1,k_2}^{1,1} \cdot x_1[n-k_1] \cdot x_2[n-k_2] + \\ \sum_{[k_1,k_2]\in K_{12}} K_{k_1,k_2}^{1,2} \cdot x_1[n-k_1] \cdot x_2^2[n-k_2] + \\ \sum_{[k_1,k_2]\in K_{12}} K_{k_1,k_2}^{2,1} \cdot x_1^2[n-k_1] \cdot x_2[n-k_2] + \ldots + \\ \sum_{[k_1,k_2]\in K_{12}} K_{k_1,k_2}^{1,O-1} \cdot x_1[n-k_1] \cdot x_2^{O-1}[n-k_2] + \ldots + \\ \sum_{[k_1,k_2]\in K_{12}} K_{k_1,k_2}^{O-1,1} \cdot x_1^{O-1}[n-k_1] \cdot x_2[n-k_2] \end{bmatrix},$$

wherein:
- y[n] represents a single output of a Volterra series;
- $x_1$ and $x_2$ represent two inputs of the Volterra series;
- K represents a kernel of the Volterra series;
- $K_0$ represents an offset term; and
- $O_1$ and $O_2$ represent order terms of a respective path of a first input $x_1$ and a respective path of a second input $x_2$, respectively.

20. The ET apparatus of claim 16 wherein the dual-input voltage mDPD circuit further comprises a training circuit configured to calibrate the dual-input memory polynomial based on a digital voltage feedback signal.

* * * * *

UNITED STATES PATENT AND TRADEMARK OFFICE
CERTIFICATE OF CORRECTION

PATENT NO. : 10,873,301 B2  
APPLICATION NO. : 16/377689  
DATED : December 22, 2020  
INVENTOR(S) : Jean-Frederic Chiron Page 1 of 1

It is certified that error appears in the above-identified patent and that said Letters Patent is hereby corrected as shown below:

In the Specification

At Column 1, Line 58, replace "60 MHz" with --$\geq$ 60 MHz--.

At Column 4, Line 23, replace "60 MHz" with --$\geq$ 60 MHz--.

At Column 4, Line 52, replace "261" with --26I--.

At Column 4, Line 55, replace "land" with --I and--.

At Column 4, Line 60, replace "$I^1$" with --$I^2$--.

At Column 6, Line 5, replace "dl$_{CC}$" with --dI$_{CC}$--.

At Column 6, Line 12, replace "60 MHz" with --$\geq$ 60 MHz--.

At Column 10, Line 52, replace "1121" with --112I--.

At Column 10, Line 55, replace "land" with --I and--.

In the Claims

At Column 13, Claim 5, Line 5, replace "resents" with --represents--.

At Column 16, Claim 18, Line 4, replace "rep resents" with --represents--.

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*